United States Patent
Watanabe

[11] Patent Number: 5,907,478
[45] Date of Patent: May 25, 1999

[54] UNIT PART MOUNTING STRUCTURE

[75] Inventor: Hideki Watanabe, Fukushima-ken, Japan

[73] Assignee: Alps Electric Co., Ltd., Tokyo, Japan

[21] Appl. No.: 08/991,393

[22] Filed: Dec. 16, 1997

[30]  Foreign Application Priority Data

Dec. 25, 1996  [JP]  Japan .................................. 8-356201

[51] Int. Cl.⁶ .................................................. H05K 5/03
[52] U.S. Cl. .......................... 361/807; 361/818; 361/752; 361/728; 361/736; 361/816; 174/35 R; 174/35 GC; 174/50; 174/52.1; 379/437; 379/440; 379/429; 379/428
[58] Field of Search .................................. 361/807, 818, 361/752, 728, 736, 816; 174/35 R, 35 GC, 50, 52.1; 379/437, 440, 429, 428

[56]  References Cited

U.S. PATENT DOCUMENTS

| | | | |
|---|---|---|---|
| 4,370,515 | 1/1983 | Donaldson | 174/35 R |
| 5,160,807 | 11/1992 | Fry et al. | 174/35 R |
| 5,365,410 | 11/1994 | Lonka | 361/816 |
| 5,559,676 | 9/1996 | Gessaman | 361/752 |

*Primary Examiner*—Leo P. Picard
*Assistant Examiner*—David Foster
*Attorney, Agent, or Firm*—Brinks Hofer GIlson & Lione

[57]  ABSTRACT

A unit part mounting structure in which mounting legs are soldered onto soldering lands at a side of the printed board to which the unit part is mounted, so that mounting of the unit part to the printed board is made easier, and repairing and replacement of the unit part can be performed without removing the printed board, thereby making it easier to perform the repairing and replacement. In conventional unit part mounting structures, the unit part is mounted to a side of the printed board not having a conductive pattern, connecting portions of a housing are inserted into holes in the printed board, and the printed board is turned upside down to solder the connecting portions. Thus, it takes time and effort to insert and solder the unit part P. The unit part mounting structure of the invention overcomes such a problem.

2 Claims, 3 Drawing Sheets

UNIT PART MOUNTING STRUCTURE

BACKGROUND OF THE INVENTION

1. Field of the Invention

The present invention relates to a structure for mounting a unit part, such as a transceiver RF unit, to be incorporated into an electronic device, such as a portable telephone.

2. Description of the Related Art

As shown in FIGS. 5 and 6, in a conventional structure for mounting a unit part to be incorporated into an electronic device (such as a portable telephone), the solderable, metallic housing 30 has mounting legs 31 extending downward from four corners thereof, with connecting portions 32 formed at the lower ends of the mounting legs 31.

The housing 30 contains a printed board (not shown) for mounting various electrical parts thereto. A unit part P, being a transceiver RF unit in this case, has a male connector 33 mounted thereto.

As shown in FIGS. 5 and 6, the printed board 35 mounted in a case 34 of an electronic device K, such as a portable telephone, has a conductive pattern (not shown) formed at the lower surface thereof, with various electrical parts (not shown) connected to the conductive pattern to form a desired circuit.

Holes 36 are formed in the printed board 35 at locations opposing the connecting portions 32 of the housing 30 of the unit part P. A female connector 37 is disposed on the side of the printed board 35 not having the conductive pattern. A terminal of the connector 37 is connected to the conductive pattern.

The unit part P is mounted to the printed board 35 in the following way. While the male connector 33 is being inserted into the female connector 37, the connecting portions 32 of the housing 30 are aligned with their respective holes 36 in the printed board 35. Then, the connecting portions 32 are inserted into their respective holes 36, after which the printed board 35 is turned upside down in order the solder the connecting portions 32 to the conductive pattern on the printed board 35, whereby the unit part P is mounted to the printed board 35.

As shown in FIG. 5, the printed board 35, having the unit part P mounted thereto in the above-described way, is placed on a mounting base 34b of the case 34, with its conductive pattern side opposing the side wall 34a of the case 34. Then, it is secured to the case 34 with a screw 38.

When the unit part P becomes defective as a result of, for example, peeling of the solder on the unit part P, while the electronic device K is being used, so that the unit part P needs repairing or replacement, the screw 38 is removed in order to take the printed board 35 out of the case 34.

Thereafter, the connecting portions 32 of the housing 30 are desoldered from the printed board 35 in order to take out the unit part P from the case 34 and repair it.

Then, as mentioned above, while inserting the male connector 33 of the repaired or replaced unit part P into the female connector 37, the connecting portions 32 thereof are inserted into their respective holes 36, and the printed board 35 is turned upside down for soldering the connecting portions 32.

Afterwards, the printed board 35 is secured to the case 34 using screw 38.

In the conventional unit part mounting structure, however, the unit part P is mounted to the side of the printed board not having the conductive pattern, the connecting portions 32 of the housing 30 are inserted into their respective holes 36 in the printed board 35, and the printed board 35 is turned upside down for soldering the connecting portions 32. As a result, it takes time and effort to insert and solder the unit part P.

In addition, in the mounting structure using the connectors 33 and 37, the mounting location of the connectors 33 and 37 is often shifted from the normal mounting location. Therefore, when the connectors 33 and 37 are aligned, the connecting portions 32 and their respective holes 36 are not aligned with respect to each other. As a result, the connecting portions 32 must be forcefully inserted into the holes 36, thus preventing easy insertion of the connecting portions 32 into their respective holes 36.

In the conventional method of repairing or replacing the unit part P, the printed board 35 must be removed for mounting the unit part P, which is troublesome to perform. In addition, after dismounting of the unit part P from the printed board 35, the solder blocks the holes 36, making it difficult and troublesome to re-insert the unit part P therein.

SUMMARY OF THE INVENTION

To overcome the above-described problems, according to a first form of the present invention, there is provided a structure for mounting a unit part, having a metal housing which houses an electronic part, onto a printed board, comprising a mounting leg of the housing; and a soldering land of the printed board, wherein the mounting leg is placed on the soldering land in order to solder them together at a side to which the unit part is mounted.

According to a second form of the present invention, the mounting leg may have a protrusion at an end thereof, and the printed board may have a recess for fitting the protrusion therein.

DESCRIPTION OF THE PREFERRED EMBODIMENTS

Figure 1:
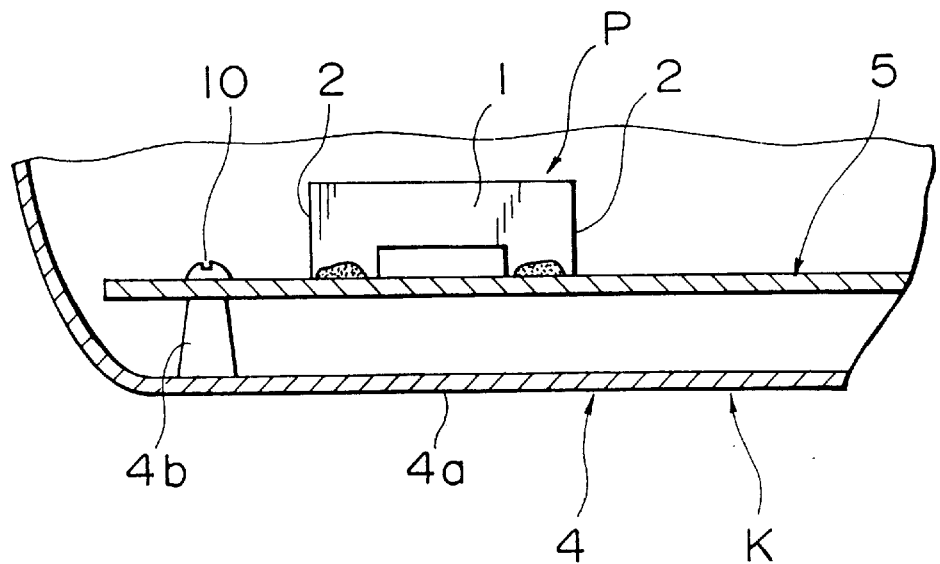
FIG. 1 is a sectional view showing the main portion of an embodiment of a unit part mounting structure in accordance with the present invention, with the unit part being incorporated in an electronic device.

A description will now be given of an embodiment of a unit part mounting structure in accordance with the present invention, with specific reference to FIGS. 1 to 3.

In the present embodiment, a transceiver RF unit is taken as an example of the unit part to be incorporated into a portable telephone used as an example of an electronic device.

The housing 1 of the unit part P is composed of a solderable metal plate, and has mounting legs 2 extending downward from the four corners of the housing 1. The housing 1 houses a printed board (not shown) for mounting thereto various electrical parts, and has a male connector 3 mounted thereto.

A conductive pattern 6 is formed on the upper surface of the printed board 5 mounted in a case 4 of an electrical device K. An insulating resist film 8 is formed on the upper surface with the conductive pattern 6, excluding the soldering lands 7 that are partly exposed.

Figure 2:
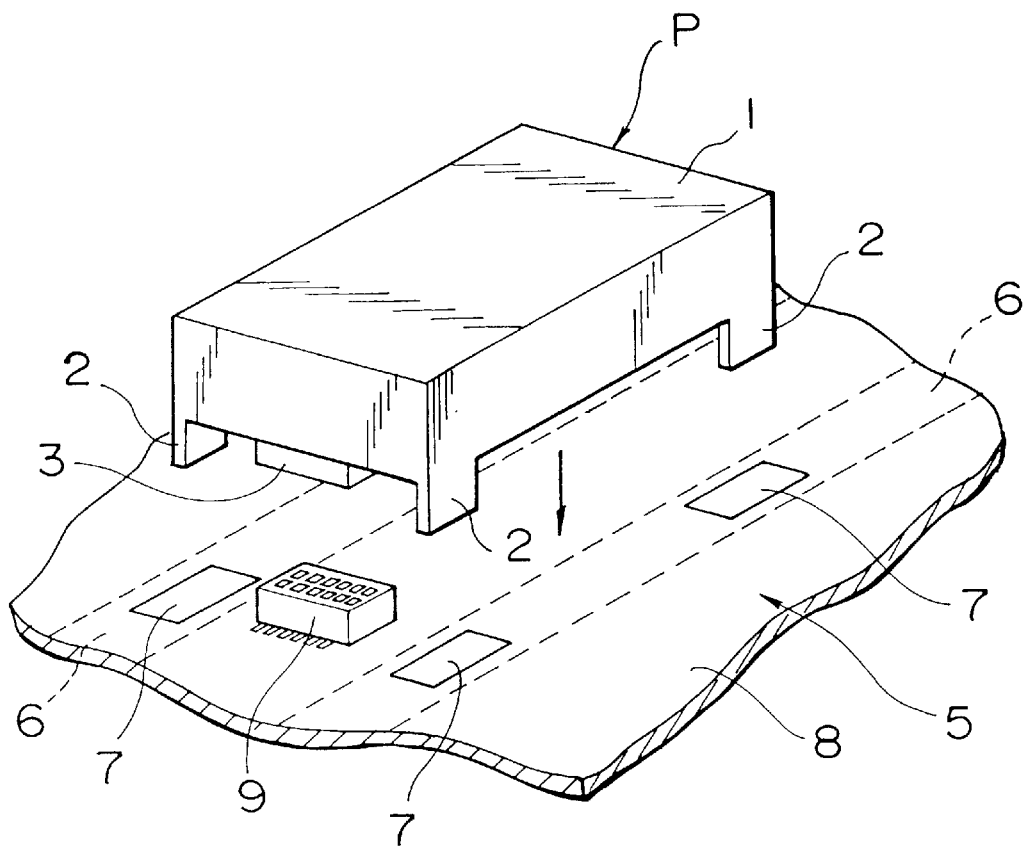
FIG. 2 is a perspective view showing the embodiment of the unit part mounting structure in accordance with the present invention, prior to mounting of the unit part to the printed board.
Figure 3:
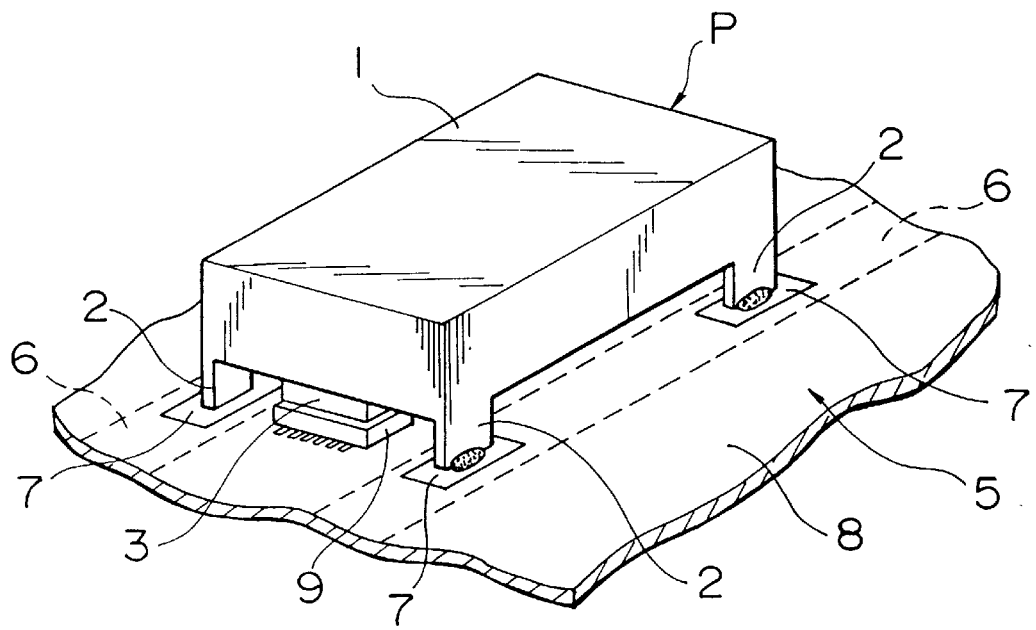
FIG. 3 is a perspective view showing the embodiment of the unit part mounting structure in accordance with the present invention, after mounting of the unit part to the printed board.

Although in FIGS. 2 and 3 only those soldering lands 7 that are provided in correspondence with the mounting legs 2 of the housing 1 are shown, a plurality of other soldering lands 7 are formed for soldering thereto various electrical parts (not shown), and a female connector 9 is also soldered onto the printed board 5, thereby forming a desired circuit.

As shown in FIG. 3, the male connector 3, mounted to the unit part P, is inserted into a female connector 8, and the lower portions of the mounting legs 2 of the housing 1 are placed on their respective soldering lands 7 on the printed board 5.

Thereafter, the outer faces of the mounting legs 2 are soldered onto the soldering lands 7, whereby the unit part P is mounted onto the printed board 5.

The printed board 5, having the unit part P mounted thereto in such a manner, is, as shown in FIG. 1, positioned such that the side of the printed board 5 not having the conductive pattern 6 opposes the inner face of a side wall 4a of the case 4. Then, the printed board 5 positioned in such a way is placed onto a mounting base 4b of the case 4, and secured to the case 4 with a screw 10.

When the unit part P becomes defective as a result of peeling of the solder on the unit part P, or the like, while the electronic device K is being used, so that the unit part P needs repairing or replacement, the unit part P can be taken out from the case 34 by desoldering the mounting legs 2 of the housing 1 from the soldering lands 7, without dismounting the printed board 5. Thereafter, the unit part P can be repaired.

Then, as mentioned above, the male connector 3 of the repaired or the replaced unit part P is inserted into the female connector 9. The mounting legs 2 are placed onto their respective soldering lands 7 in order to solder the outer faces of the mounting legs 2 onto their respective soldering lands 7.

Figure 4:
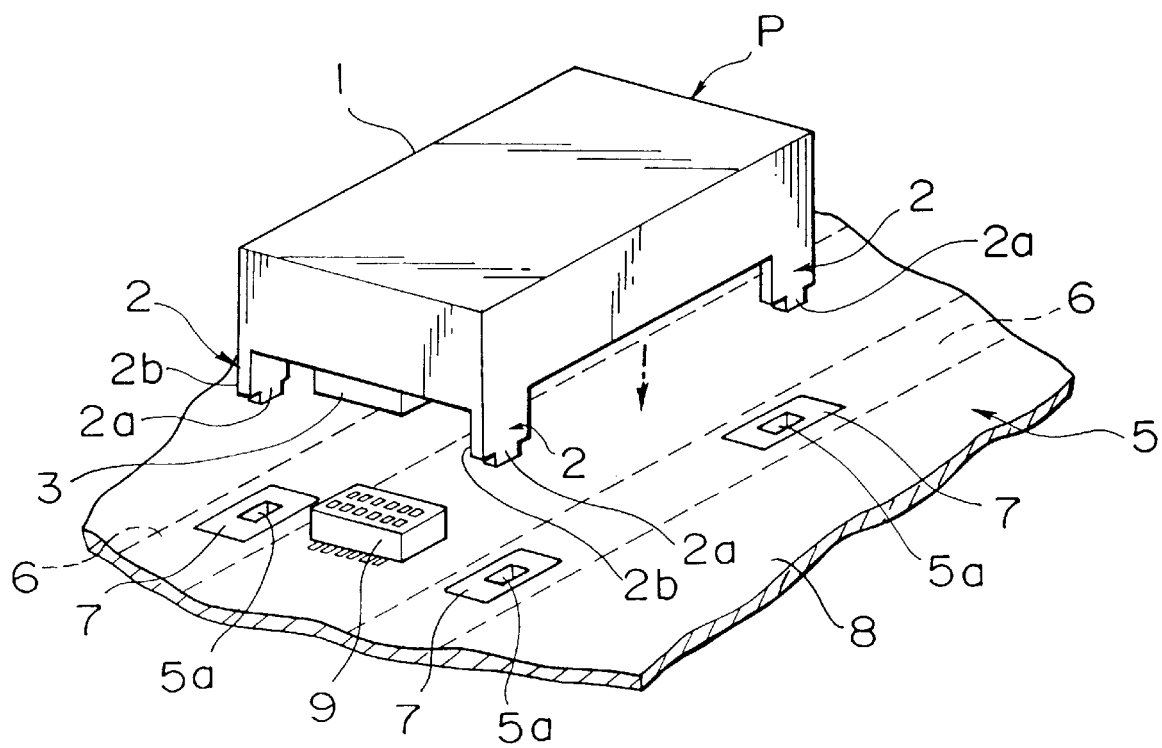
FIG. 4 is a perspective view of another embodiment of a unit part mounting structure in accordance with the present invention, prior to mounting of the unit part to the printed board.
Figure 5:
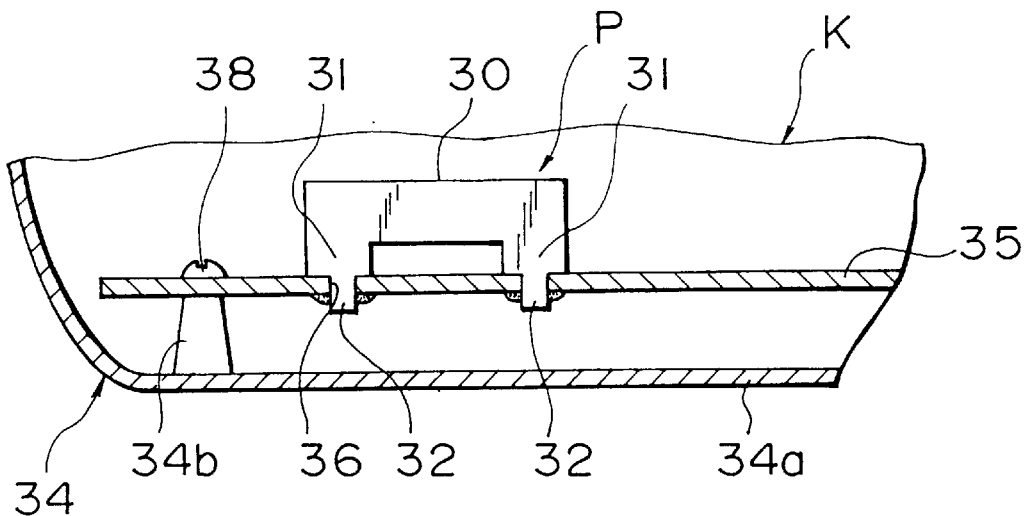
FIG. 5 is a sectional view showing the main portion of a conventional unit part mounting structure, with the unit part incorporated in an electronic device.
Figure 6:
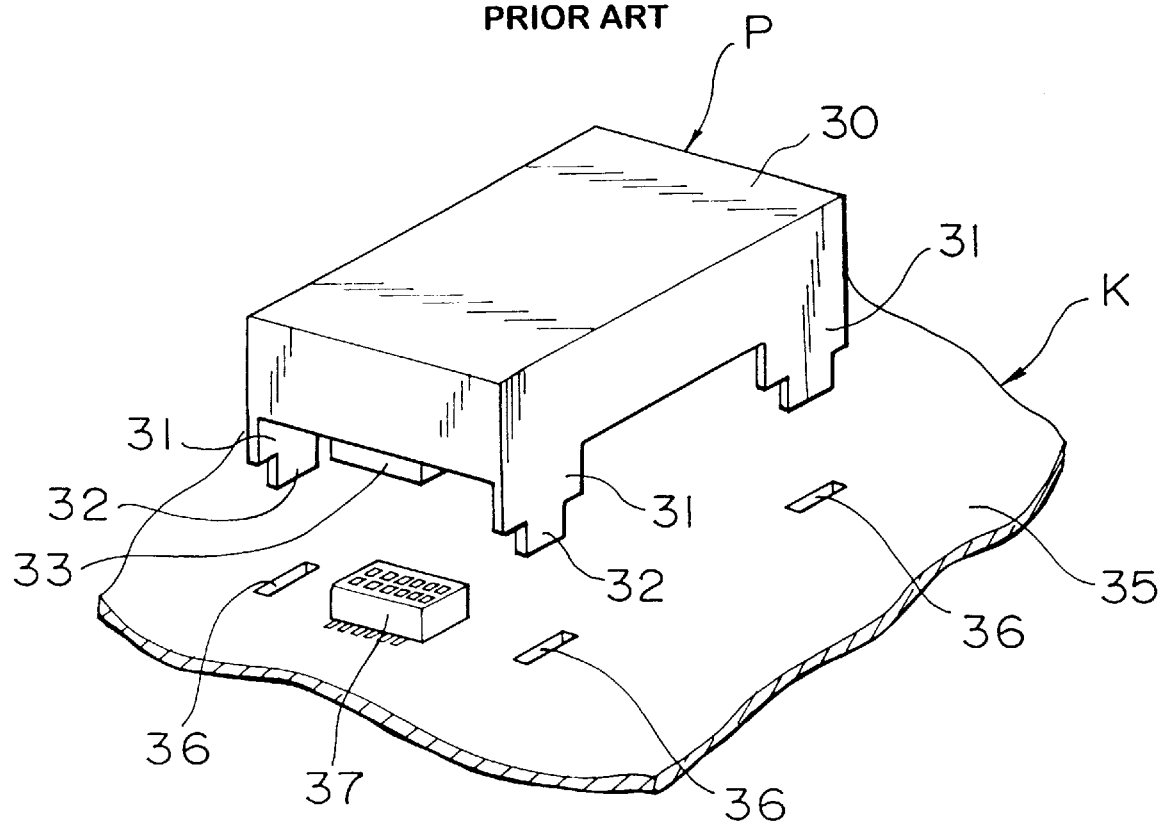
FIG. 6 is a perspective view of the conventional unit part mounting structure, prior to assembly of the unit part to the printed board.

FIG. 4 shows another embodiment of the present invention. In this embodiment, protrusions 2a are formed at the lower ends of the mounting legs 2 of the housing 1. Recesses 5a are formed in correspondence with the aforementioned protrusions 2a, and also in correspondence with the locations of the soldering lands 7 on the printed board 5. The protrusions 2a are fitted into their corresponding recesses 5a in order to position and temporarily secure the housing 1 onto the printed board 5, followed by soldering of the outer ends 2b of the mounting legs 2 onto their respective soldering lands 7.

The soldering locations of the mounting legs 2 may be selected in accordance with the arrangement of other component parts, as required.

The other component parts correspond to those of the previously-described embodiment, so that they are given the same reference numerals as their corresponding parts and are not described.

Obviously, the printed board 5 of the present embodiment may have conductive patterns 6 formed on both sides thereof.

According to the present invention, the mounting legs are soldered onto the soldering lands at the side of the printed board to which the unit part is mounted. This facilitates mounting of the unit part to the printed board, and allows repairing or replacement of the unit part, without dismounting the printed board from the unit part, thereby making it easier to repair and replace the unit part.

In addition, when protrusions are formed on the mounting legs, and recesses are formed in the printed board, the unit part can be positioned with respect to the printed board and temporarily secured thereto, by fitting the protrusions into the recesses, thereby facilitating soldering of the unit part onto the printed board.

What is claimed is:

1. A structure for mounting a unit part, having a metal housing which houses an electronic part, onto a printed board, comprising:

a mounting leg of said housing; and a soldering land of said printed board wherein said soldering land is disposed on the side of said printed board to which said unit part is mounted, wherein said mounting leg is placed on said soldering land in order to solder them together at a side to which said unit part is mounted.

2. A structure according to claim 1, wherein said mounting leg has a protrusion at an end thereof, and said printed board has a recess for fitting the protrusion therein.

* * * * *